United States Patent [19]
Emons et al.

[11] Patent Number: 6,100,152
[45] Date of Patent: Aug. 8, 2000

[54] METHOD OF MANUFACTURING A SEMICONDUCTOR DEVICE WITH A FAST BIPOLAR TRANSISTOR

[75] Inventors: Catharina H. H. Emons, Nijmegen; Doede Terpstra, Eindhoven; Cornelis E. Timmering, Eindhoven; Wiebe B. De Boer, Eindhoven, all of Netherlands

[73] Assignee: U.S. Philips Corporation, New York, N.Y.

[21] Appl. No.: 09/387,629

[22] Filed: Aug. 31, 1999

[30]     Foreign Application Priority Data

Aug. 31, 1998 [EP]  European Pat. Off. .............. 98202894

[51] Int. Cl.$^7$ .................. H01L 21/331; H01L 27/082
[52] U.S. Cl. .................. 438/350; 438/309; 438/357; 438/365; 257/565; 257/592
[58] Field of Search ............................ 257/557, 563, 257/565, 591, 592; 438/309, 349, 350, 357, 365, 368, 370, 375

[56]        References Cited

U.S. PATENT DOCUMENTS

| | | | |
|---|---|---|---|
| 3,600,651 | 8/1971 | Duncan | 317/234 |
| 4,824,799 | 4/1989 | Komatsu | 438/348 |
| 5,073,810 | 12/1991 | Owada et al. | 257/588 |
| 5,117,271 | 5/1992 | Comfort et al. | 257/198 |
| 5,321,301 | 6/1994 | Sato et al. | 257/592 |
| 5,480,816 | 1/1996 | Uga et al. | 438/309 |

FOREIGN PATENT DOCUMENTS

0795899A1  9/1997  European Pat. Off. .

OTHER PUBLICATIONS

"Ultra–Thin–Base Si Bipolar Transistor using Rapid Vapor–Phase Direct Doping (RVD)", by Y. Kiyota et al., IEEE Transactions on Electron Devices, vol. 39, No. 9, Sep. 1992.

*Primary Examiner*—Donald L. Monin, Jr.
*Assistant Examiner*—Hoai Pham
*Attorney, Agent, or Firm*—Steven R. Biren

[57]         ABSTRACT

The invention relates to a method of manufacturing a discrete or integrated bipolar transistor comprising a base (1A), an emitter (2) and a collector (3). The base (1A) and a connecting region (1B) of the base (1A) are formed by providing a semiconductor body (10) with a doped semiconducting layer (1) which locally borders on a monocrystalline part (3) of the semiconductor body which forms the collector (3). Outside said base, the layer (1) borders on a non-monocrystalline part (4) of the semiconductor body (10) and forms a non-monocrystalline connecting region (1B) of the base (1A). By means of a mask (5), the doping concentration of the layer (1) outside the mask (5) is selectively increased, resulting in a highly conducting connection region (1B) and a very fast transistor. In the known method, an ion implantation is used for this purpose. In a method in accordance with the invention, this is achieved by bringing the semiconductor body (10) into contact with a gaseous substance (40) comprising a doping element, and heating the semiconductor body (10) in such a manner that the doping elements penetrate into the semiconducting layer (1). Such a method surprisingly results in a much faster transistor. It has been found that this enables, on the one hand, a much smaller diffusion in the thickness direction of the doping of the base (1A) to be achieved, which results in a much faster transistor, particularly, if the base (1A) contains SiGe. On the other hand, the lateral diffusion from the connecting region (1B) to the base (1A) is particularly strongly suppressed. This too has a beneficial effect on the speed of the transistor. The supply of the gaseous substance (40), for example diborane, preferably takes place at a temperature between 800 and 950° C. for one to several minutes. Subsequently, a slightly longer diffusion step can be carried out, for example, at 850° C.

9 Claims, 3 Drawing Sheets

FIG. 7

METHOD OF MANUFACTURING A SEMICONDUCTOR DEVICE WITH A FAST BIPOLAR TRANSISTOR

BACKGROUND OF THE INVENTION

The invention relates to a method of manufacturing a semiconductor device comprising a semiconductor body with a bipolar transistor including a base, an emitter and a collector, said base being formed by providing the semiconductor body with a doped semiconducting layer (1) which locally borders on a monocrystalline part of the semiconductor body (10), thereby forming a first semiconductor region which is monocrystalline and which constitutes the base of the transistor, and which semiconducting layer borders, at locations outside said base, on a non-monocrystalline part of the semiconductor body, thereby forming a second semiconductor region which is not monocrystalline and which constitutes a connection region of the base, and, after the provision of the semiconducting layer, this layer being provided, above the base, with a mask, whereafter, outside said mask, the doping concentration of the semiconducting layer is selectively increased. Such a method enables very fast transistors to be manufactured in a simple manner.

Such a method is known from United States patent specification U.S. Pat. No. 5,117,271, published on May 26, 1992. In said document, a description is given of a method in which a mesa is formed in a semiconductor body, which mesa is the collector of the transistor to be formed. The mesa is formed by making grooves in a monocrystalline silicon substrate provided with an epitaxial layer. Thus, the mesa forms a monocrystalline part of the semiconductor body. The grooves are filled with an insulating oxide and hence constitute a non-monocrystalline part of the semiconductor body. By means of a growth process, subsequently, a doped semiconductive layer of silicon is provided on both parts of the semiconductor body. Above the mesa, this layer forms a monocrystalline base, and above the insulating oxide, the layer forms a non-monocrystalline, in this case polycrystalline, region which serves as the connecting region of the base. Such a method, in which the base is manufactured by means of a growth process, enables very fast bipolar transistors to be manufactured. This can be attributed to the fact that a base produced by means of a growth process can be readily provided, in the course of the growth process, with an optimum doping profile for the speed of the transistor. The same applies to the provision of a heterojunction, for example a Si—SiGe heterojunction, by means of which the maximum speed of the transistor can be increased too. Also a possible graduation of the composition of a SiGe part of the base enables even higher speeds to be attained, because the connection losses are reduced. To maximize the speed of the transistor, it is desirable, however, for the resistance of the connecting region to be as low as possible. To achieve this, the grown semiconductive layer is locally masked above the base, and, outside the mask, the semiconductive layer is provided with a higher doping concentration by means of an ion implantation. The transistor is completed by diffusing an emitter in (a part of) the base.

A drawback of the known method is that the resultant transistors are not as fast as desired.

SUMMARY OF THE INVENTION

Therefore, it is an object of the present invention to provide a method by means of which fast transistors can be obtained, and which is as simple as possible.

To achieve this, in accordance with the invention, a method of the type mentioned in the opening paragraph is characterized in that the selective increase of the doping concentration of the semiconductive layer is obtained by bringing the semiconductor body into contact with a gaseous substance which contains a doping element, while heating the semiconductor body such that doping elements can penetrate into the semiconductive layer or into an oxide layer present thereon. Experiments revealed that the maximum speed of the transistor was limited by diffusion in the thickness direction of the doping elements which are incorporated therein during the provision of the semiconductive layer to obtain an optimum doping profile for the base. It has been found that this is particularly detrimental to the speed of the transistor if a part of the base is formed by a SiGe mixed crystal. Since diffusion of germanium occurs hardly, or not at all, a spread of said doping profile of the base in the thickness direction enables the base doping to extend beyond the SiGe mixed crystal. This adversely affects the speed of the transistor since it causes the metallurgic junction to be situated in front of the heterojunction so that the SiGe transistor degrades to a Si transistor. Further analysis has revealed that the temper step and, particularly, the crystal damage caused by ion implantation is responsible for this undesirable diffusion. It has surprisingly been found that supplying a gaseous substance including a doping element and simultaneously heating the semiconductor body is very effective for obtaining a low-ohmic base connecting region in a polycrystalline layer, and that this can be carried out in such a manner that diffusion of the base doping in the thickness direction is very low. The method in accordance with the invention has the additional advantage that also diffusion of doping elements in the lateral direction is low. This too can be attributed to the absence of crystal damage and to the apparent possibility of employing a very favorable thermal budget in a method in accordance with the invention. These effects have the additional advantage that very small, and as a result thereof also very fast transistors can be obtained.

In a preferred embodiment of a method in accordance with the invention, the doping elements which have penetrated into the semiconducting layer, or into the oxide skin thereon, are fed further into the semiconducting layer by means of a diffusion step. This results, in spite of a minimal thermal budget, in a substantial reduction of the resistance of the connecting region across a substantial part of its thickness. The diffusion step may be carried out simultaneously with the supply and penetration of the doping elements, or after the supply (and penetration) of the doping elements. Very suitable manufacturing conditions for a npn transistor include the supply of diborane as a gaseous substance, which includes a doping element, and heating of the semiconductor body to a temperature between 800 and 950° C. for one to several minutes. In a suitable, separate diffusion step, heating is carried out, for example, for 10 to 20 minutes at 850° C.

For the reason described hereinabove, the semiconducting layer is preferably made of SiGe in the case of a silicon transistor. The doping of the base is preferably formed so as to be a so-called "spike" which is situated inside the SiGe (mixed crystal). By virtue thereof, it is achieved that even if the doping exhibits a slight diffusion in the thickness direction, it will still remain within a silicon-germanium-containing part of the semiconducting layer.

The non-monocrystalline part of the semiconductor body is formed, for example, by an insulating oxide. This may be a groove filled with an insulator, as in the known method, but also a so-called LOCOS oxide. Preferably, however, the non-monocrystalline part of the semiconductor body is formed by covering it locally with a polycrystalline layer. Such a layer enhances the growth of the semiconducting layer and may also advantageously be used to further reduce the resistance of the connecting region of the base. This is achieved by providing the polycrystalline layer with a very high doping concentration of the same conductivity type as the semiconducting layer. By means of diffusion, a part of this doping will be transferred to the connecting region of the base situated above the polycrystalline layer. Since the polycrystalline layer is not situated below the base, all this does not influence the doping concentration of said polycrystalline layer.

A further reduction of the resistance of the connecting region of the base can be achieved by partly converting the parts of the semiconducting layer situated outside the mask into a conductive layer, preferably by introducing metal atoms into the semiconducting layer. A layer of, for example, titanium which is provided outside the mask is capable of converting an upper part of the connecting region of the base into a titanium silicide. In this case, it is very desirable for the upper part of the semiconducting layer to not contain germanium, i.e. exclusively silicon, because, for example, titanium germanide segregates and hence adversely affects the quality of the silicide.

Preferably, the transistor is further completed by surrounding the mask used for selectively increasing the doping concentration of the semiconducting layer by a further mask and subsequently selective removing it, whereafter a further polycrystalline semiconductor region is provided in the resultant aperture. In this manner, an emitter and a connecting region of the emitter are formed. Such a method enables the desired, very fast transistor to be obtained in a simple and controllable manner.

BRIEF DESCRIPTION OF THE DRAWINGS

These and other aspects of the invention will be apparent from and elucidated with reference to the embodiments described hereinafter.

In the drawings:

The Figures are diagrammatic and not drawn to scale, particularly the dimensions in the thickness direction being exaggerated for clarity. Semiconductor regions of the same conductivity type are generally hatched in the same direction. Like reference numerals refer to like regions whenever possible.

FIGS. 1 through 7 are diagrammatic, cross-sectional views, at right angles to the thickness direction, of a semiconductor device with a bipolar transistor at successive stages in the manufacture using a method in accordance with the invention.

DESCRIPTION OF THE PREFERRED EMBODIMENTS

Figure 7:
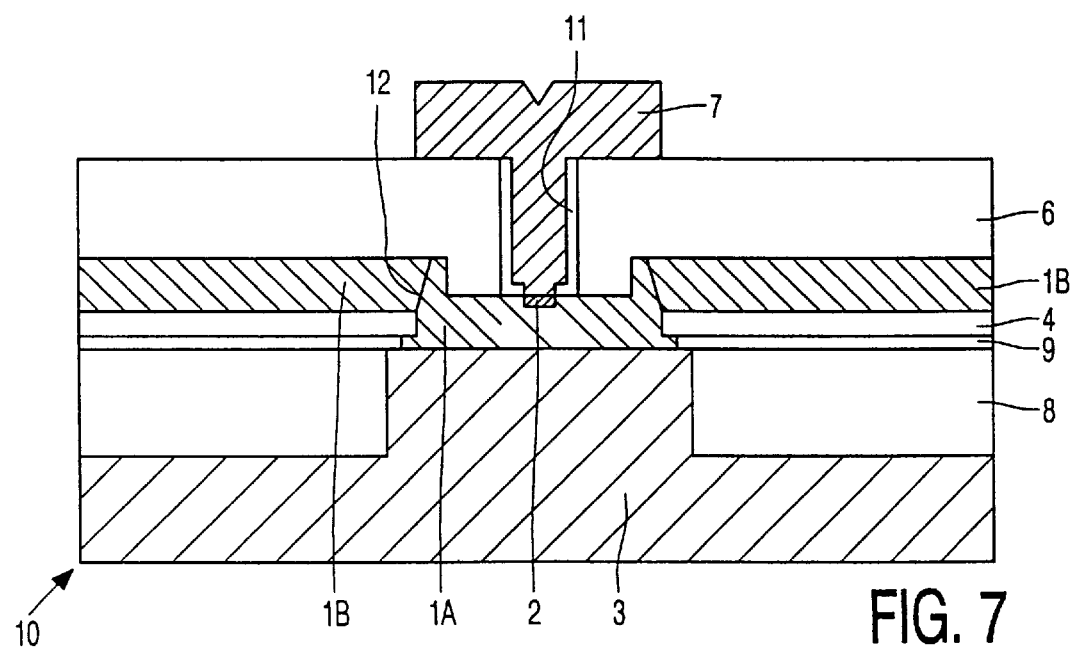

FIG. 7 is a diagrammatic, cross-sectional view, at right angles to the thickness direction, of the completed device. The semiconductor body 10 comprises a monocrystalline silicon substrate, not shown in the drawing, which in this case is doped with antimony n$^+$, the resistivity of which is 6–20 mΩcm and which is covered with an approximately 1 μm thick monocrystalline epitaxial layer 3 of n-type silicon having a doping concentration of approximately $1 \times 10^{16}$ at/cm$^3$. Said epitaxial layer 3 accommodates an approximately 0.4 μm thick, recessed insulation region 8, in this case a so-called LOCOS oxide, which surrounds the collector 3 and which is covered with an (additional) thermal oxide 9 having a thickness of 10 nm. In this example, a polycrystalline p-type silicon layer 4 having a thickness of 40 nm and a doping concentration of approximately $1 \times 10^{20}$ at/cm$^3$ is provided on said thermal oxide. A p-type semiconducting layer 1 which, in this case, is 120 nm thick, extends over said p-type silicon layer and over the collector 3, said p-type semiconducting layer comprising SiGe with 20 at. % germanium across the first 40 nm. The part 1A of the semiconducting layer 1 bordering on the collector 3 is monocrystalline and forms a base 1A of the transistor. The remaining part 1B of the semiconducting layer 1 is polycrystalline, borders on the polycrystalline layer 4, and forms a connecting region 1B of the base 1A of the transistor. An interface 12 constitutes the transition between both parts 1A, 1B of the semiconducting layer 1. At the location of the base 1A, the doping concentration is $4 \times 10^{19}$ at/cm$^3$, at the location of the connecting region 1B, the doping concentration is higher and amounts to $5 \times 10^{20}$ at/cm$^3$. Above the semiconducting layer 1, there is a 0.25 μm thick insulating layer of silicon dioxide having a recess above the base 1A, the walls of said recess being covered with spacers 11 and the recess being filled with an emitter connection 7 of n-type polycrystalline silicon having a doping concentration of approximately $10^{21}$ at/cm$^3$. An n-conductivity type emitter 2 of the transistor is recessed in the base 1A, which emitter is 40 mn thick and has a doping concentration of $1 \times 10^{20}$ at/cm$^3$. The device further comprises (not shown in the Figure) electrical connections of the connecting region 7 of the emitter 2, electrical connections of the connecting region 1B of the base 1A and (also not shown in the drawing) electrical connections of a connecting region of the collector 3. The other dimensions of the device of the example are as follows: the width of the (shown part of the) semiconductor body 10 is approximately 4 μm, the width of the collector is approximately 1 μm, the width of the mask 5 is approximately 0.5 μm.

Figure 1:
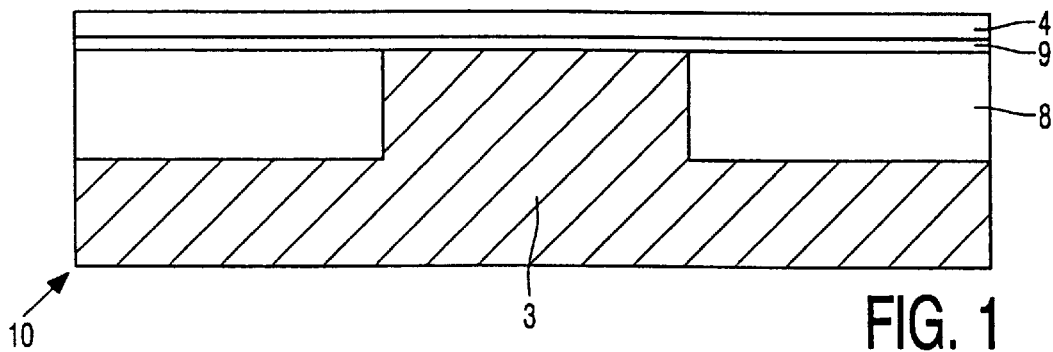
FIGS. 1 through 7 are diagrammatic, cross-sectional views, at right angles to the thickness direction, of a semiconductor device with a bipolar transition at successive stages in the manufacture using a method in accordance with the invention.

The device of this example is manufactured, for example, in the manner described hereinbelow using a method in accordance with the invention. A p-type silicon substrate 1A is first provided with an epitaxial n-type silicon layer 3 (see FIG. 1). In said silicon layer a so-called LOCOS oxide 8 is formed so as to be recessed therein, said LOCOS oxide surrounding a collector 3 of the transistor to be formed. Subsequently, the semiconductor body is subjected to thermal (further) oxidation, resulting in the formation of an insulating layer 9. On said insulating layer, a polycrystalline p$^+$-silicon layer 4 is deposited by means of CVD.

Figure 2:
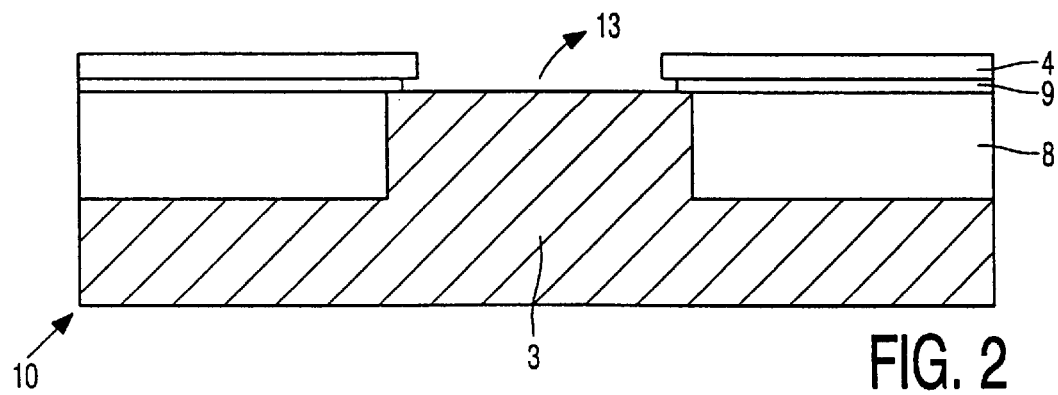

Subsequently, by means of photolithography and plasma etching (see FIG. 2) an aperture 13 is made in the polycrystalline layer 4 above the collector 3. The insulating layer 9 serves as an etch stop in this process. The aperture 13 is then extended down to the insulating layer 9 by means of a customary etchant. In this process, the underlying silicon of the collector 3 serves as an etch stop.

Figure 3:
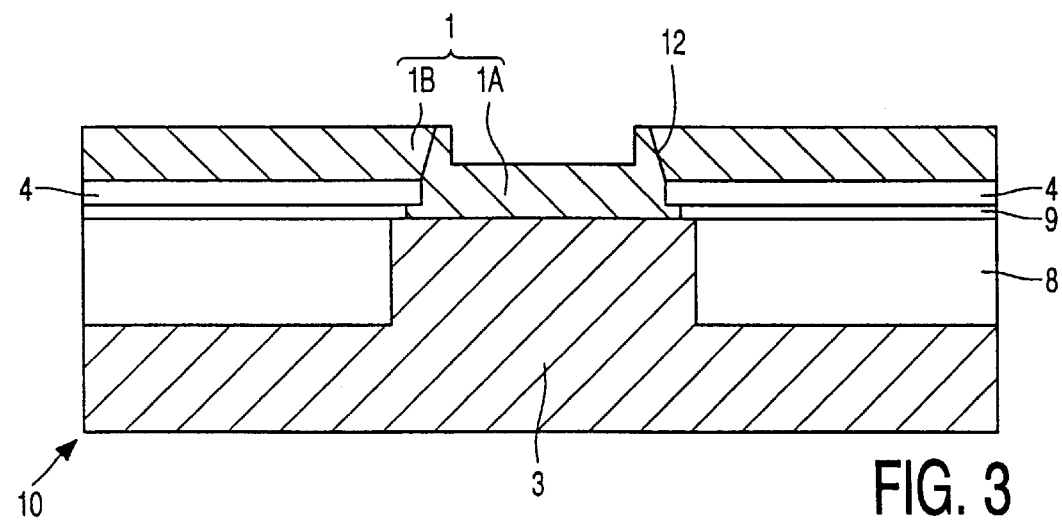

Next, the surface of the semiconductor body 10 (see FIG. 3) is provided with a semiconductive layer 1 by means of gas-phase epitaxy. This takes place at a temperature ranging from 550 to 650° C. from a gas mixture containing hydrogen, silane and germane. The composition of the gas and the growth conditions are such that the semiconducting layer 1 comprises, within the first 40 nm, SiGe with a germanium content of 20 at. %. Above the monocrystalline collector 3, the semiconducting layer 1 is also monocrystalline and forms a base 1A of the transistor. Outside this base 1A, a polycrystalline region 1B is formed above the polycrystalline layer 4, which polycrystalline region 1B constitutes a connecting region 1B of the base 2. The polycrystalline layer 4 enhances a uniform growth of the semiconducting layer 1 and hence also a uniform transition 12 between the parts 1A, 1B of the semiconducting layer 1. During the growth of the conducting layer 1, diborane is added for a short period of time to the above-mentioned gas mixture used in said process, thus causing the conducting layer to be provided with a 5 to 40 nm, here 10 nm, thick p-type "spike" doping. As a result, the doping concentration ranges from 0.1 to $5 \times 10^{20}$ at/cm$^3$, in this example $4 \times 10^{19}$ at/cm$^3$, which is a very suitable value for the base 1A of a fast transistor.

Figure 4:
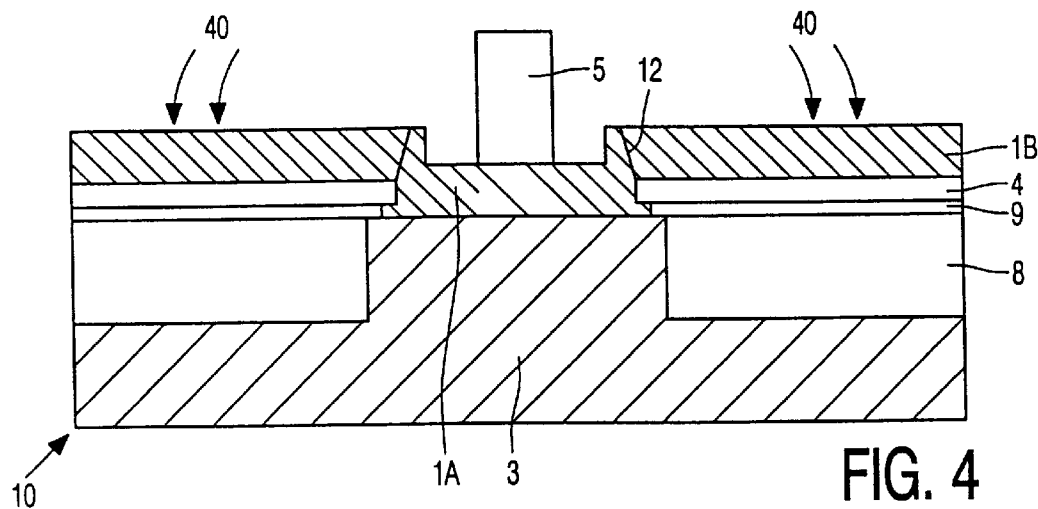

Subsequently, (see FIG. 4) the semiconducting layer 1 is provided, above the base 1A, with a 0.2 to 0.5 μm thick mask 5. This is achieved by providing a layer 5 of, in this case, silicon nitride by means of CVD (=Chemical Vapor Deposition), which layer is patterned by means of photolithography and etching. The mask 5 is used to selectively increase the doping concentration of a part of the semiconducting layer, predominantly the connecting region 1B of the base 1A, which part is situated outside the mask 5.

In accordance with the invention, this is achieved by heating the semiconductor body 10 and simultaneously exposing it to an atmosphere containing a gaseous substance 40 with a doping element, the heating of the semiconductor body being such that doping elements from the gaseous substance 40 penetrate the semiconducting layer 1. By virtue hereof, the method in accordance with the invention surprisingly results in a transistor which is faster than it would be if said selective increase of the doping concentration were carried out by means of an ion implantation, as in the known method. It has been found that the crystal damage caused by an ion implantation and the tempering step necessary to repair said damage result in impermissible diffusion in the thickness direction of the doping elements in the base 1A. If the doping elements diffuse beyond the germanium-containing part of the transistor, this results, in fact, in a degradation of the transistor to a less fast silicon transistor. In this respect, the method in accordance with the invention is much better. An additional advantage of the method in accordance with the invention is that also lateral diffusion of doping elements is much smaller, particularly lateral diffusion towards the base 1A of the doping elements added extra selectively to the connecting region 1B of the base 1A. This cannot only be attributed to the absence of the thermal load caused by the tempering step, but also to the absence of crystal damage due to an ion implantation. This damage is of course predominantly situated in the connecting region 1B, but also extends slightly in the base 1A, even below the mask 5. This crystal damage does not only enhance the above-mentioned diffusion in the thickness direction but also in the lateral direction. Besides, it can be partly attributed to both effects that a very small transistor can be made by means of a method in accordance with the invention. This too has a favorable effect on the maximum speed of the transistor.

In this example, the selective increase of the doping concentration of the connecting region 1B takes place in two steps. The supply and the penetration of the doping elements takes place at a temperature ranging between 800 and 950° C., in this case at 900° C., for a few minutes. Subsequently, in a second step, the supply of the gaseous substance 40 is stopped, but heating of the semiconductor body 10 is continued, for example for 15 minutes at 850° C., thus causing a further penetration of the doping elements into the semiconducting layer 1 by means of diffusion. In the method of this example, simultaneously, diffusion of doping elements from the polycrystalline layer 4 to the connecting region 1B of the base 1A of the transistor takes place. To achieve this, the polycrystalline layer 4 is provided, in this example, with a (very high) p-type doping concentration of $1 \times 10^{20}$ at/cm$^3$. Since the polycrystalline layer 4 does not extend below the base 1A of the transistor, all this does not affect the doping concentration of the base 1A. The resultant transistor is very fast, which can be partly attributed to a very low resistance of the connecting region 1B of the base 1A.

Figure 5:
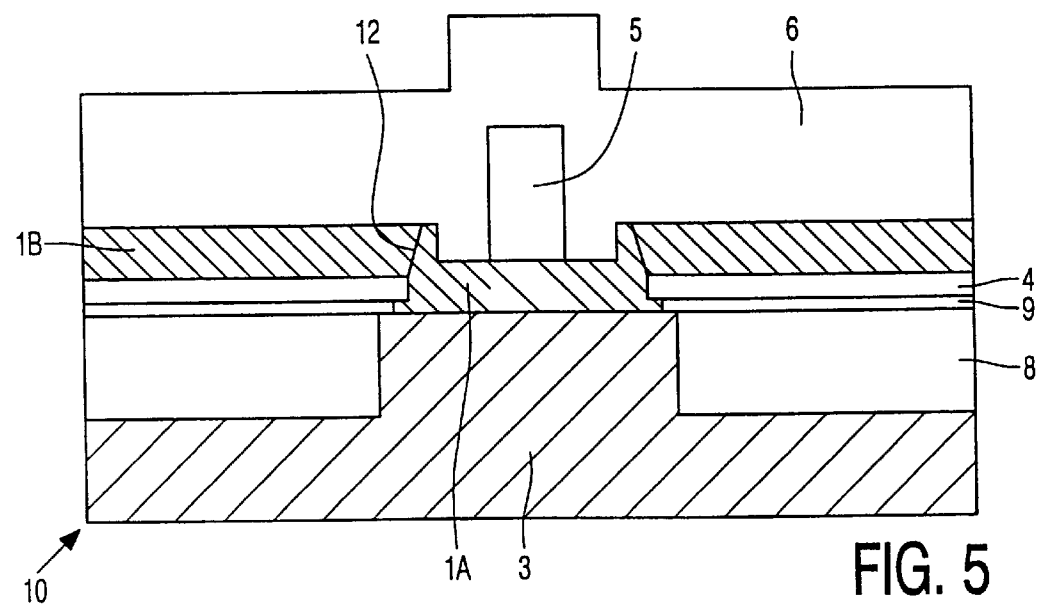
Figure 6:
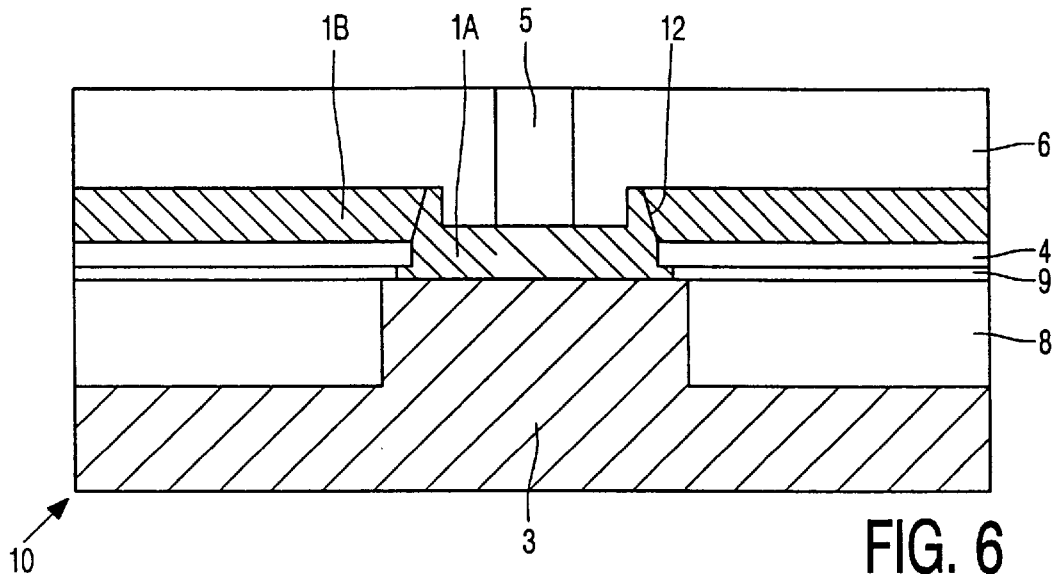

The manufacture is continued in the following manner (see FIG. 5). The mask 5 is provided with a further masking layer 6, which in this case contains a TEOS (=TetraEthyl OxySilicate). By means of CMP (=Chemical Mechanical polishing) the structure is planarized (see FIG. 6), so that the mask 5 is surrounded by a further mask 6. Next, the mask 5 is removed by means of (selective) etching. The walls of the resultant aperture (see FIG. 7) are provided with, in this case, "L"-shaped spacers 11 of, for example, silicon nitride. This takes place by first uniformly covering the semiconductor body with a silicon nitride layer 11 and subsequently largely removing this layer by etching back. As a result, an aperture in the silicon nitride layer which extends down to the surface of the base 1A is formed in the bottom of the aperture formed after removal of the mask 5. After the provision of a connecting region 7 of n-type polycrystalline silicon (doping concentration $1 \times 10^{21}$ at/cm$^3$) an emitter 2 of the transistor is formed in the base 1A by means of a suitable heat treatment. After the connecting regions of the base 1A, the collector 3 and the emitter 2 have been provided with electrical connections, the transistor is ready for final assembly.

The invention is not limited to the above-mentioned examples, and within the scope of the invention many modifications and variations are possible to those skilled in the art. For example, compositions and thicknesses for the different (semiconductor) regions or layers may be selected which differ from those mentioned in the examples. It is also possible to use different deposition techniques, such as MBE (=Molecular Beam Epitaxy) and CVD (=Chemical Vapor Deposition). Also the manufacturing process may be modified in various ways.

Also the geometry and dimensions of the various regions of the transistor may be selected so as to be different.

A device in accordance with the invention may also be a more complex device than a single bipolar transistor. The device may comprise a number of different active or passive electronic components. The transistor may also form part of a BI(C) MOS (=BIpolar (Complementary) Metal Oxide Semiconductor) IC.

What is claimed is:

1. A method of manufacturing a semiconductor device comprising a semiconductor body with a bipolar transistor including a base, an emitter and a collector, said base being formed by providing the semiconductor body with a doped semiconducting layer which locally borders on a monocrystalline part of the semiconductor body, thereby forming a first semiconductor region which is monocrystalline and which constitutes the base of the transistor, and which semiconducting layer borders, at locations outside said base, on a non-monocrystalline part of the semiconductor body, thereby forming a second semiconductor region which is not monocrystalline and which constitutes a connecting region of the base, and, after the provision of the semiconducting layer, this layer being provided, above the base, with a mask, whereafter, outside said mask, the doping concentration of the semiconducting layer is selectively increased, characterized in that the selective increase of the doping concentration of the semiconducting layer is obtained by bringing the semiconductor body into contact with a gaseous substance which contains a doping element, while heating the semiconductor body such that doping elements can penetrate into the semiconducting layer.

2. A method as claimed in claim 1, characterized in that the doping elements which have penetrated into the semiconducting layer, are fed further into the semiconducting layer by means of a diffusion step.

3. A method as claimed in claim 1, characterized in that for at least a part of the semiconductor material of the semiconducting layer, a mixture of silicon and germanium is selected.

4. A method as claimed in claim 1, characterized in that the doping provided during the provision of the semiconducting layer is provided within the part of the semiconducting layer which comprises silicon and germanium.

5. A method as claimed in claim 1, characterized in that the non-monocrystalline part of the semiconductor body is formed by an insulating region bordering on the surface of the semiconductor body.

6. A method as claimed in claim 1, characterized in that the non-monocrystalline part of the semiconductor body is formed by a polycrystalline layer which is preferably heavily doped and provided with the same conductivity type as the semiconducting layer.

7. A method as claimed in claim 1, characterized in that an upper part of the semiconducting layer comprises exclusively silicon, and the upper parts of the semiconducting layer situated outside the mask are converted to a conductive layer, preferably by reacting them with a metal.

8. A method as claimed in claim 1, characterized in that the mask used for the selective increase of the doping concentration of the semiconducting layer is surrounded by a further mask, and is subsequently selectively removed, whereafter a further polycrystalline semiconductor region is provided in the resultant aperture, said semiconductor region being used to form the emitter of the transistor and said semiconductor region forming a connecting region of the emitter.

9. A method as claimed in claim 1, wherein an npn transistor is manufactured, characterized in that for the doping element-containing gaseous substance use is made of diborane, and the semiconductor body is heated to a temperature in the range between 800 and 950° C.

* * * * *